United States Patent [19]
Dalal et al.

[11] 4,214,256
[45] Jul. 22, 1980

[54] TANTALUM SEMICONDUCTOR CONTACTS AND METHOD FOR FABRICATING SAME

[75] Inventors: Hormazdyar M. Dalal, Wappingers Falls; Majid Ghafghaichi, Poughkeepsie; Lucian A. Kasprzak, Hopewell Junction; Hans Wimpfheimer, Poughkeepsie, all of N.Y.

[73] Assignee: International Business Machines Corporation, Armonk, N.Y.

[21] Appl. No.: 941,100

[22] Filed: Sep. 8, 1978

Related U.S. Application Data

[62] Division of Ser. No. 827,912, Aug. 26, 1977.

[51] Int. Cl.² .............. H01L 23/48; H01L 29/46; H01L 29/54
[52] U.S. Cl. .......................... 357/71; 357/15; 357/67
[58] Field of Search .................... 357/15, 54, 67, 71

[56] References Cited

U.S. PATENT DOCUMENTS

| | | | |
|---|---|---|---|
| 3,633,076 | 1/1972 | Arndt | 357/67 |
| 3,806,778 | 4/1974 | Shimakura et al. | 357/54 |
| 3,813,762 | 6/1974 | Kniepkamp | 357/15 |
| 3,906,540 | 9/1975 | Hollins | 357/15 |
| 4,034,394 | 7/1977 | Kamo et al. | 357/15 |
| 4,107,726 | 8/1978 | Schilling | 357/71 |
| 4,141,020 | 2/1979 | Howard et al. | 357/15 |
| 4,146,413 | 3/1979 | Yonezawa et al. | 357/71 |

OTHER PUBLICATIONS

IBM Technical Disclosure Bulletin, vol. 16, No. 11, Apr., 1974 by Reith et al. Al/pts: Schottky Barrier Diodes, p. 3586.
IBM Technical Disclosure Bulletin, vol. 17 No. 10 Mar., 1975 by Gani, et al., Logic Circuit—Diodes, p. 2856.

*Primary Examiner*—Andrew J. James
*Attorney, Agent, or Firm*—David M. Bunnell; Thomas F. Galvin

[57] ABSTRACT

A silicon semiconductor device having contacts which include tantalum. The tantalum is useful in particular for fabricating Schottky barrier diodes having a low barrier height. The method includes: precleaning the silicon substrate prior to depositing the tantalum; depositing the tantalum at low pressure and low substrate temperature to avoid oxidation of the tantalum; and sintering the contact to reduce any interfacial charges and films remaining between the silicon and tantalum. When a metal which reacts with silicon during processing, such as aluminum, is used as interconnection metallurgy, a layer of chrome must be deposited between the tantalum and aluminum.

6 Claims, 9 Drawing Figures

TANTALUM SEMICONDUCTOR CONTACTS AND METHOD FOR FABRICATING SAME

This is a division of application Ser. No. 827,912 filed 8/26/77.

BACKGROUND OF THE INVENTION

1. Field of the Invention

The present invention relates to metallurgies for contacting silicon semiconductors to form ohmic and Schottky barrier diode contacts.

2. Description of the Prior Art

The requirements for a material or combination of materials to provide ohmic and Schottky barrier contacts to semiconductor substrates are very stringent from both an electrical and chemical standpoint.

Numerous metallurgical systems which are known to semiconductor designers have been proposed and utilized as ohmic and Schottky barrier diode contacts. The single most successful metal used in interconnections of silicon planar transistors and integrated circuits is aluminum or aluminum which is doped with a small amount of copper. Aluminum makes good ohmic and mechanical contact to the silicon and to the surrounding insulation layers. It is easy to deposit by standard evaporation or sputtering techniques and can be easily patterned by etching or similar techniques. However, aluminum has a tendency to interact with silicon, particularly during high temperature processing. In addition, aluminum alone forms neither a very high-nor a low-barrier height Schottky barrier contact to silicon.

The literature is replete with various other metallurgical systems which fulfill one or more functions as metallurgical contacts. One of the most successful of these systems is a titanium-tungsten alloy which has achieved widespread use in the industry as a barrier layer between aluminum and silicon. However, titanium-tungsten cannot be evaporated onto a semiconductor substrate; it must be sputtered. Thus, this alloy cannot be patterned using a lift-off process.

For quite some time a need has existed for a Schottky barrier diode with a low barrier height, i.e., around 0.5 electron volts. For example, in a diode transistor logic (DTL) circuit, it is desirable that the barrier height of the input diodes be around 0.5 electron volts. In particular, the DTL type circuit commonly referred to as $C^3L$ is most useful when the Schottky diodes, which perform the input AND function in the circuit, exhibit said barrier height. The $C^3L$ circuit is described in the publication by A. W. Peltier entitled "Advances in Solid-State Logic—A New Approach to Bipolar LSI: $C^3L$, 1975 IEEE International Solid-State Circuits Conference, Digest of Technical Papers, pages 168–169. Peltier states that either titanium, tungsten or titanium-tungsten alloy satisfy this requirement. However, these contacts have the shortcoming which we have discussed hereinbefore.

SUMMARY OF THE INVENTION

It is therefore the primary object of our invention to provide semiconductor devices having improved contacts and interconnections thereon.

Another object of our invention is to provide an improved single metallurgical system which is useful for forming both ohmic as well as high-and low-barrier-height Schottky barrier contacts.

It is still another object of our invention to improve the method for depositing tantalum to achieve a Schottky barrier contact having carefully controlled barrier height characteristics.

It is a further object of our invention to provide a metallurgical contact system which is compatible with aluminum interconnection metallurgy.

These and other objects of our invention are achieved by a novel method of depositing tantalum on silicon, which results in a selectable, carefully controlled, low-barrier-height diode. In particular, when tantalum is deposited directly on N-type silicon with our novel method, a barrier height of 0.5 electron volts is achieved. The diode remains extremely stable during extensive stress testing.

The method includes: preparing the surface of the silicon to prevent the formation of amorphous silicon, preferably by cleaning the silicon substrate in dilute HF under controlled radiation conditions prior to depositing the tantalum; depositing the tantalum in a vacuum at low pressure and substrate temperature to avoid oxidation of the tantalum; and sintering the contact to reduce any interfacial charges and films remaining between the silicon and tantalum.

The deposition of tantalum may be accomplished by E-beam evaporation in a vacuum of $2.5 \times 10^{-6}$ torr maximum and a substrate temperature of 200° C. maximum. It may also be accomplished by RF sputtering in a chamber which has an initial vacuum of $4 \times 10^{-7}$ torr prior to sputtering.

Tantalum deposited in this way is also useful both as an ohmic contact when disposed atop a metallic silicide formed in N+ type silicon as well as a high-barrier-height SBD when disposed atop a metallic silicide formed in N-type silicon.

When aluminum is used as interconnection metallurgy, a layer of chrome must be deposited between the tantalum and aluminum. The chrome is formed by the use of a water-bleeding technique during the evaporation or sputtering of elemental chromium. The long-term reliability of this metallurgical system is outstanding.

DETAILED DESCRIPTION

Figure 1A:
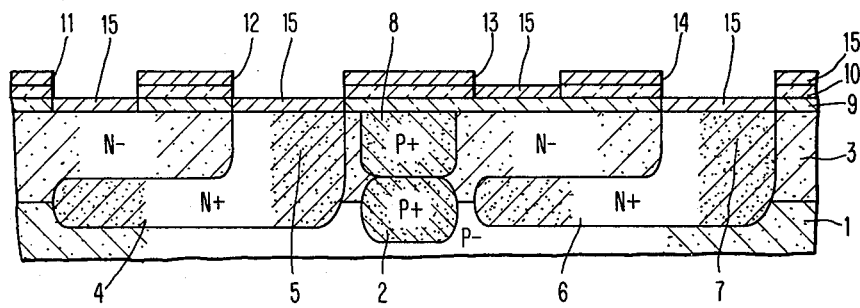
FIGS. 1A-1F are fragmentary, sectional views of a semiconductor device incorporating our invention during various stages of fabrication.

Referring to the drawing, FIG. 1A illustrates that portion of a semiconductor chip which is to contain the Schottky barrier diodes (SBD) of our invention. It will be understood by those of skill in the art that many thousands of the diodes and other semiconductor devices such as transistors, resistors, etc. will ordinarily be contained within the same chip. The chip substrate is illustrated as P-type silicon, for example, having a typical resistivity of 10 ohm-cm. Disposed on said substrate 1 is an N-layer 3 which preferably exhibits a conductivity of from $1\times10^{16}$ to $8\times10^{16}$ atoms per cm$^3$. Buried within the structure are regions 4 and 6 having associated therewith reachthrough regions 5 and 7 respectively. The substrate also contains P+ subisolation region 2 which, in association with P+ isolation region 8, separates the N+ regions.

Regions 2, 4 and 6 are advantageously formed by the standard process of diffusing said regions into windows 10 which expose portions of the bare substrate 1. Typical N+ impurities are arsenic or phosphorus; a typical P+ impurity is boron.

The masking layer is then stripped from substrate 1 by conventional etching techniques and layer 3 is grown epitaxially, thereby causing regions 2, 4 and 6 to outdiffuse into layer 3. A masking layer which is typically a composite of silicon oxide layer 9 and silicon nitride layer 10 is then formed on the surface of layer 3 and windows are made in the composite layer through which N+ and P+ impurities are diffused to form reach-through regions 5 and 7 and isolation region 8, respectively.

A platinum layer 15 is then deposited in blanket fashion atop layer 10 and within windows 11, 12, 13 and 14. Preferably, the platinum is deposited to a thickness of around 400 Å by evaporation or sputtering. Silicon dioxide layer 9 in the window 13 prevents the platinum within that window from contacting the substrate.

Figure 1B:
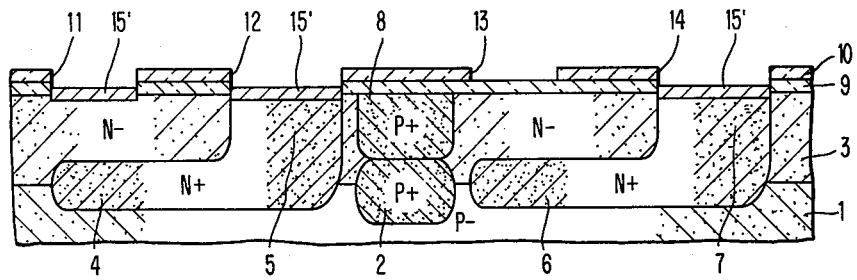

Referring to FIG. 1B, the wafer is then sintered at around 550° C. for twenty minutes in a nitrogen ambient to cause the platinum to react with the silicon to form platinum silicide 15' in windows 11, 12 and 14. The unreacted platinum, including that which is atop oxide layer 10, is then removed by etching in aqua regia. As is known, other metals such as palladium, nickel or hafnium could replace platinum. In the next step of the process as shown in FIG. 1C, that portion of silicon dioxide layer 9 which is disposed in window 13 is removed by standard wet or dry etching techniques to expose that portion of the substrate which is to constitute the anode of the low-barrier-height Schottky barrier diode (SBD).

The deposition of our novel metallurgy system is then performed into windows 11–14. The preferred process includes the lift-off technique described in U.S. Pat. No. 4,004,044, which issued in the names of Franco et al and is assigned to the same assignee as the present application. This process is illustrated in abbreviated form in FIGS. 1D–1F and will be described below. Alternate techniques for forming the metallurgy are standard wet or reactive ion (plasma) subtractive etching processes which are well known to those of skill in the art. However, the lift-off technique is capable of providing superior definition of metallurgy, thereby minimizing the area required for wiring.

Figure 1C:
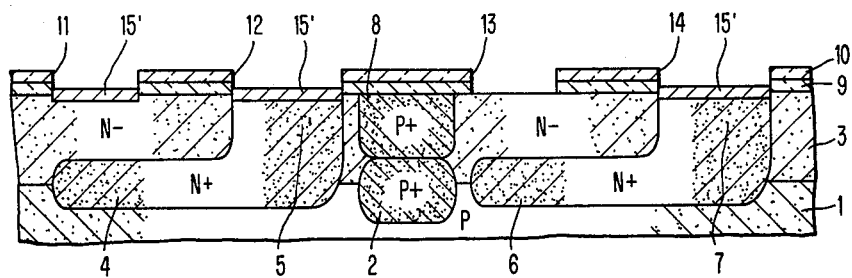
Figure 1D:
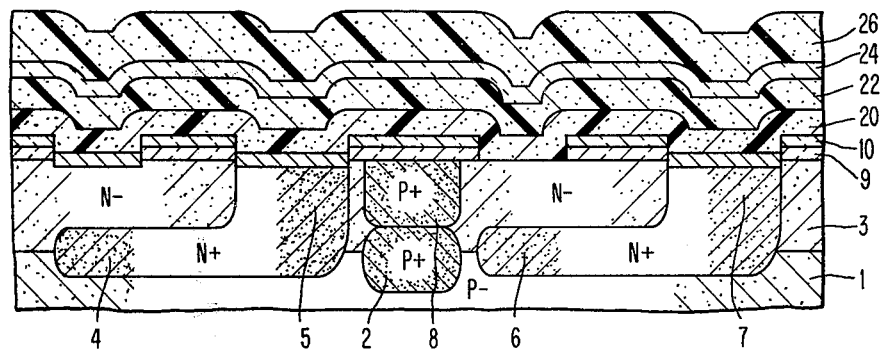

Turning now to FIG. 1D the lift-off process commences with the blanket deposition of a thin layer of polyether sulfone which facilitates the lift-off process. The use of polysulfone is a modification of the aforementioned patent to Franco et al and has been described in the article by Carr et al entitled "Stripping Promotor for Lift-Off Mask", IBM Technical Disclosure Bulletin, Volume 19, No. 4, September 1976, page 1226. Disposed atop polysulfone layer 20 is a layer 22 of an organic polymer material such as a novalak-resin-based positive resist which is baked to 210°–230° C. to render it non-photosensitive. Atop layer 22 is coated a methyl- siloxane resin barrier layer 24 followed by a layer 26 of a radiation sensitive resist.

Layer 26 is subjected to radiation and is developed to provide a patterned relief image corresponding to windows 11, 12, 13 and 14 of FIG. 1C. Resist mask 26 is then used to permit selective removal of the underlying layers 20, 22 and 24 to expose the windows 11', 12', 13' and 14' illustrated in FIG. 1D, which correspond to the windows illustrated in FIG. 1C.

After the windows are formed, the exposed substrate, including the platinum silicide layer 15, is precleaned in a 15:1, or lower, water to hydrofluoric acid etchant under controlled radiation conditions. A ratio of 5:1 is most advantageous. By controlled radiation conditions we mean that no substantial amount of light having a wavelength shorter than 5000 Å may be present during the etching step. This surface preparation step prevents the formation of an amorphous silicon film in the contact region, which is deleterious since it causes an increased barrier height. The preparation of the silicon surface is a requirement to achieve a low-barrier-height SBD, i.e., around 0.5 volts. We had tried to clean the surface using a chemical etch under white light, which is a standard technique. With this technique however, we could not achieve a low enough barrier height, the results being a barrier height of around 0.61 electron volts. Alternatively, we had tried the technique of in-situ sputter cleaning in a sputtering chamber. This technique did yield a barrier height of around 0.5 electron volts; but the ideality factor is too high-around 1.15. In addition, the barrier height is not repeatable from run to run.

Returning to FIG. 1E, a layer of tantalum 28 is blanket-deposited atop the substrate and the lift-off mask. To achieve a low-barrier-height contact, the tantalum deposition process also must conform to an exacting procedure. The desposition is best accomplished in an E-beam evaporation source such as is marketed by the Airco-Temescal Corp. as their Model FC1800 System. Similar types of evaporation systems are available from other vendors. The maximum pressure in the evaporation chamber during the process is $2.5\times10^{-6}$ torr, with the initial pressure in the chamber being less than $4\times10^{-7}$ torr. The maximum temperature of the substrate is 200° C. The importance of the pressure lies in the amount of moisture, hydrocarbon and other gaseous contaminants present in the chamber. The higher the pressure, the greater the moisture and contaminants, which cause the tantalum to oxidize slightly, resulting in a barrier height of greater than 0.5 electron volts. If a barrier light of this value is acceptable, then the pressure in the chamber is of less significance and routine processes may be used. The deposition process, which occurs at a rate of around 2 Å per second, continues until a thickness of 600 Å±150 Å is achieved. The tantalum which is formed using this method is body-centered-cubic (BCC).

As an alternative to evaporation, tantalum may be RF-sputter deposited under the same initial pressure and temperature conditions. D.C. sputtering is inappropriate, as D.C. sputtered tantalum is body-centered-tetragonal, whereas RF sputtered tantalum is BCC.

Following the evaporation of tantalum layer 28, layer 30 of chrome and layer 32 of aluminum or copper-doped aluminum or copper-doped aluminum-silicon are next deposited, preferably in the same evaporation chamber.

The chrome is deposited to a preferred thickness of between 600 Å and 1000 Å. Water vapor must be bled into the chamber during the evaporation. The substrate is held at 160° C. maximum or with no heat whatever being applied to the substrate. In the process, a slug of chromium is placed in the hearth and water vapor is bled into the evaporation chamber, which is held at about $10^{-5}$ torr. When heated with an electron beam the chromium is evaporated from the hearth and converted to chrome, which is critical to the formation of a barrier layer. Water-bled chrome has chromium grains with the presence of chromium oxide in the grain boundaries. We have found that pure chromium is ineffective as a barrier between aluminum and tantalum.

Figure 1E:
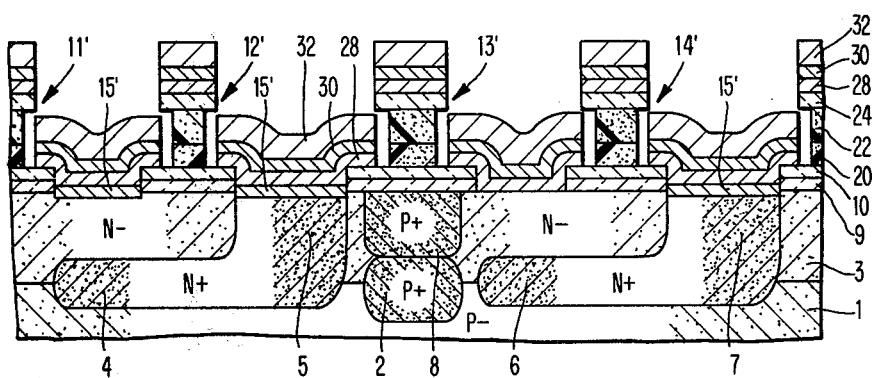

The aluminum is advantageously deposited to a thickness of 8,500 to 10,000 Å. Aluminum doped with a small amount of copper is preferable to pure aluminum. We use the term aluminum to also include both copper-doped aluminum as well as copper-doped aluminum-silicon. The resultant intermediate structure thereby achieved is illustrated in FIG. 1E.

Figure 1F:
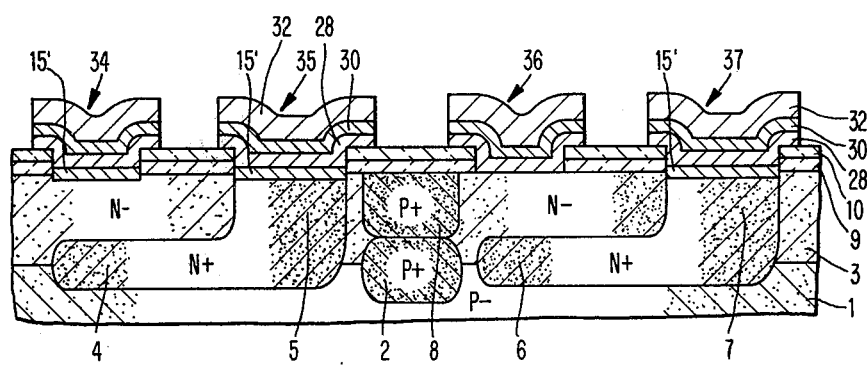

The remaining lift-off structure and overlying metal are quickly lifted off, using N-methylpyrrolidone or another suitable solvent to leave the pattern of metal adhered to the surface of the substrate or oxide layer 10 as shown in FIG. 1F.

Next, the structure is sintered at 400° C. for one hour and then at 450° C. for another two hours. This sintering step is important in order to reduce interfacial charges and films between the silicon substrate and the tantalum. Although the particular time and temperature stated are most advantageous, other values may be obtained with routine experimentation which are also effective. This sintering step is necessary to achieve a barrier height of 0.5 electron volts, even if tantalum alone were used as the contact material, i.e., in the absence of chrome and aluminum.

This completes our basic process and leaves both high-barrier-height and low-barrier-height SBD's. The anode and cathode of the high-barrier-height SBD are identified by the numerals 34 and 35, respectively, in FIG. 1F. The anode and cathode of the low-barrier-height SBD are identified by the numerals 36 and 37, respectively.

We have thus fashioned three different types of contacts using the same metallurgy. The cathodes of both diodes are ohmic contacts to N+ regions 5 and 7 in layer 3. The anode 34 of the high-barrier-height SBD uses the chrome-tantalum metallurgy between the platinum silicide 15 and aluminum 32 to act as a diffusion barrier, with the platinum silicide yielding an increased barrier height as compared to anode 36 of the low-barrier-height SBD, where no platinum silicide is present. In region 36 the tantalum itself contacts the N-silicon substrate 3 directly.

In practice, the tantalum is not necessary in forming the high-barrier-height SBD. A contact comprising aluminum, chrome and platinum silicide is perfectly satisfactory. However, it is more practical in a manufacturing environment to deposit the tantalum in blanket fashion within all contact openings.

We have found that chrome layer 30 is critical in acting as a barrier to prevent interaction of aluminum and tantalum. As is well known in the art, aluminum reacts deleteriously with silicon and will also penetrate platinum silicide to interact with silicon. Contrary to what would be expected in this art, however, tantalum and aluminum react to form a highly resistive film when the sintering step is performed. It is therefore necessary to interpose chrome as a barrier between the aluminum and the tantalum. As a result the series resistance is substantially reduced, typically from around one megohm to around 100 ohms. We have also found that platinum is not an effective barrier material between aluminum and tantalum because platinum also reacts with aluminum, causing aluminum penetration to the tantalum.

Figure 2:
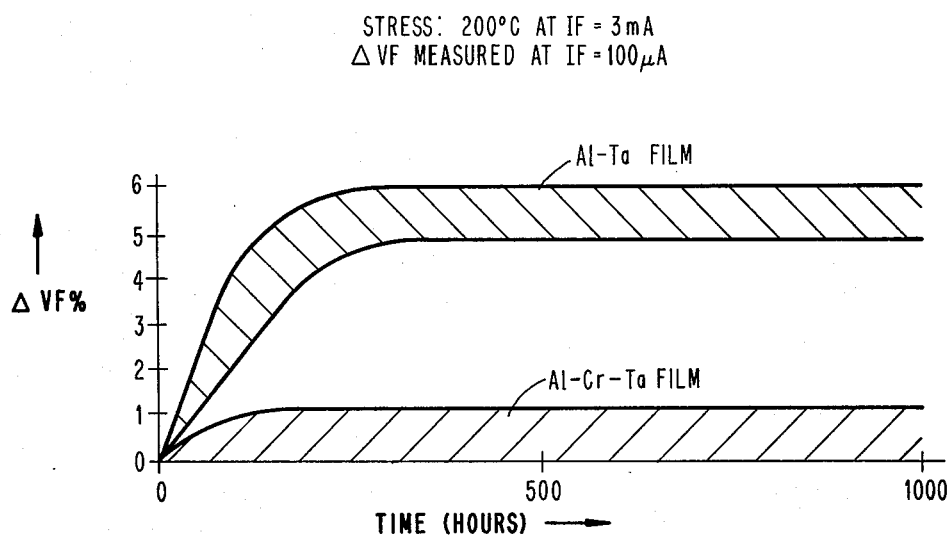
FIG. 2 is a graph of the change in voltage characteristic vs. time, under stress, of a chrome-tantalum SBD as compared with a tantalum SBD when aluminum is deposited thereon.

The critical nature of interposing a chrome barrier between the tantalum and the aluminum is well illustrated by referring to the graph in FIG. 2. The graph shows the percentage change in forward voltage ($\Delta VF\%$) versus time for a SBD comprising a composite of tantalum and copper-doped aluminum as compared to a composite of tantalum, chrome and copper-doped aluminum. It can be seen that the latter metallurgy is from four to six times more stable than the former.

Figure 3:
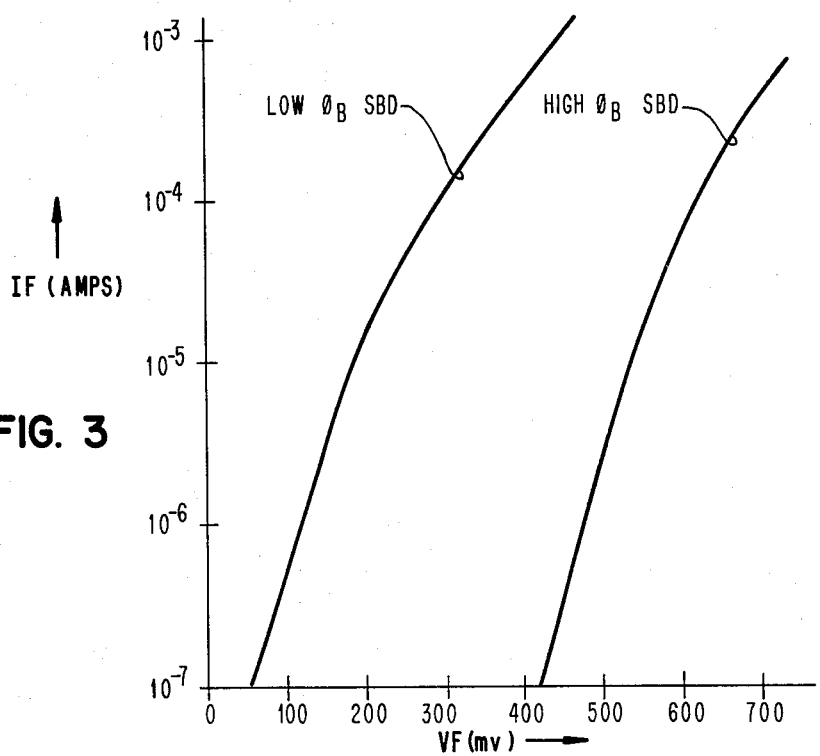
FIG. 3 is a graph of the forward current-voltage characteristics of both high- and low-barrier-height SBD's made in accordance with our invention.

FIG. 3 is a graph of the measured forward current-voltage characteristics of high- and low-barrier-height SBD's fabricated in accordance with our invention on the same chip. The anode areas of both SBD's are the same. The barrier height, $\phi_B$, of the low-barrier-height SBD is approximately 0.5 electron volts. The ideality factor, $\eta$, is approximately 1.10.

The barrier height, $\phi_B$, of the high-barrier-height SBD is approximately 0.8 electron volts. The ideality factor, $\eta$, is approximately 1.06.

Figure 4:
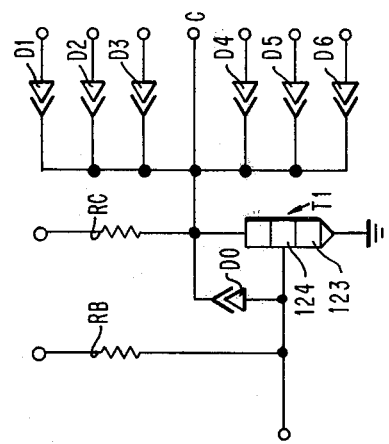
FIG. 4 illustrates a DTL type logic circuit.

As previously mentioned, our invention is particularly useful in integrated circuits requiring low-barrier-height SBD's. One such circuit, shown in FIG. 4, is a prior art DTL type circuit which performs a NAND function. This circuit forms no part of our invention per se and is well known to those of skill in the semiconductor design art. It will also be understood that our invention is in no way limited to this particular circuit or layout in a chip. In fact, our invention is applicable to various circuits such as TTL, standard DTL, etc.

This type of circuit and its variations are described in the paper by Peltier entitled "A New Approach to Bipolar LSI: $C^3L$", 1975 IEEE International Solid-State Circuits Conference, Digest of Technical Papers, pages 168–169. The circuit comprises a single transistor T1, a pair of biasing resistors, denoted RB and RC, connected, respectively, to the base and collector of transistor T1, and a high-barrier-height SBD DO, used as a clamp. The gate has six connectable outputs, in the form of low-barrier-height SBD's denoted D1, D2, D3, D4, D5 and D6 as well as an ohmic contact to the collector, denoted C.

Figure 5:
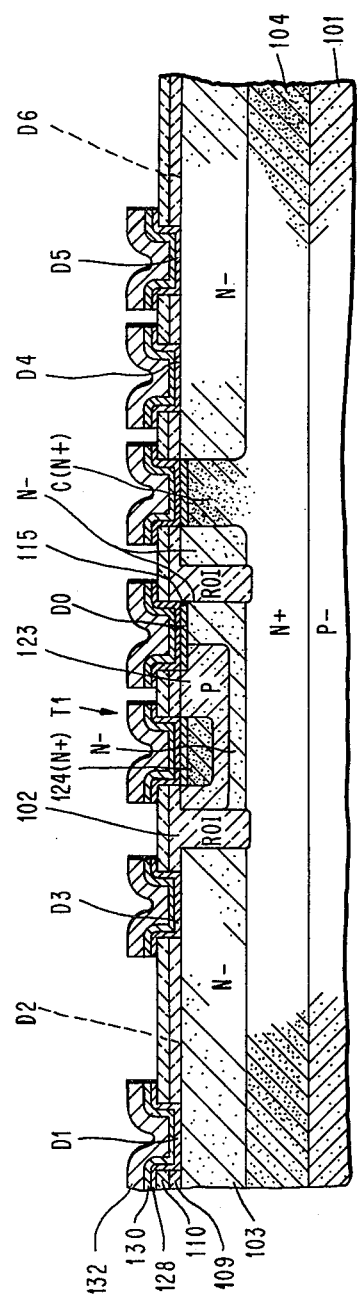
FIG. 5 illustrates a cross-section of said circuit in semiconductor form having Schottky barrier diodes formed in accordance with our invention.

FIG. 5 is a cross-sectional view of a DTL cell; each of these cells is repeated hundreds of times in the same fashion on a semiconductor chip as is well known to those of skill in the semiconductor art.

Transistor T1 comprises an elongated subcollector region 104, base region 123 and emitter region 124. Schottky barrier diodes D1, D2 . . . , D6 are formed symmetrically on each side of transistor T1 in epitaxial layer 103. A collector contact C completes transistor T1. Resistors RB and RC are not shown. As illustrated in FIG. 5, only those diodes which are actually connected in the circuit have the novel metallization necessary to actually form the diodes. Thus, the number of impurity regions actually utilized is less than the maximum number of diodes which could be; and the locations of unutilized diodes D2 and D6 are shown by dashed lines.

Diodes D1, D3, D4 and D5 are low-barrier-height SBD's formed in accordance with our invention. They comprise N-type silicon 103, tantalum layer 128, chrome layer 130 and aluminum-copper interconnection metallurgy 132 for a $\phi_B$ of approximately 0.5 electron volts. Clamp diode DO also includes a platinum silicide layer 115, yielding a $\phi_B$ of approximately 0.8 electron volts.

As alternatives to the lift-off process for forming the metallurgical pattern, either subtractive, reactive ion (plasma) or chemical etching may also be used. The same critical steps of precleaning, vacuum chamber conditions and sintering must be observed. As previously mentioned, these processes are not as advantageous as lift-off.

In each of these etching processes, blanket layers of tantalum, chrome and copper-doped aluminum or copper-doped aluminum-silicon are deposited in the windows 11, 12, 13 and 14 illustrated in FIG. 1. A positive pattern is defined with a positive resist such as AZ1350 or AZ111, which are marketed by the Shipley Company.

The now-exposed, unwanted metal layers are removed by standard metal wet etchants in the subtractive process or by placing the substrate in a plasma etching chamber which contains a $CCl_4$—Ar gas mixture in the plasma etching process.

In the chemical etching process, the exposed aluminum is removed by a mixture of $H_3PO_4$—$HNO_3$—$H_2O$. The exposed chrome is then removed by a mixture of 50 grams of $KMnO_4$ and 1 liter of AZ1350 developer. The tantalum is then removed by sputter etching using the remaining aluminum as a mask. If the width of the metallurgical pattern is greater than 0.5 mils, the tantalum may be removed by a mixture of 1 part HF, 20 parts $HNO_3$ and 20 parts $H_2O$.

While the invention has been particularly shown and described with reference to preferred embodiments thereof, it will be understood by those skilled in the art that the foregoing and other changes in form and detail may be made therein without departing from the spirit and scope of the invention.

For example, although the invention has been described with particular reference to an integrated circuit structure wherein ohmic contacts and high-and low-barrier Schottky barrier contacts are made, it is not necessary to fabricate all such contacts to come within the purview of our invention.

We claim:

1. A semiconductor contact comprising:
    a silicon semiconductor substrate;
    a layer of tantalum disposed atop said substrate;
    a layer of chrome containing chromium oxide disposed atop said tantalum layer; and
    a layer of aluminum disposed atop said chrome layer.

2. A semiconductor contact as in claim 1 wherein said substrate exhibits N- type conductivity, thereby forming a Schottky barrier diode.

3. A semiconductor contact as in claim 1 wherein said substrate exhibits N+ conductivity and further comprising:
    a layer of metal silicide disposed between said layer of tantalum and said substrate, thereby forming an ohmic contact.

4. A semiconductor contact as in claim 1 wherein said tantalum layer is around 600 Å thick and said chrome layer is around 800 Å thick.

5. A Schottky barrier diode which exhibits a barrier height of around 0.5 electron volts comprising:
    a silicon semiconductor substrate having an N type impurity concentration of from $1 \times 10^{16}$ to $8 \times 10^{16}$ atoms per $cm^3$;
    a layer of tantalum disposed atop said substrate; and
    a layer of chrome containing chromium oxide disposed atop said tantalum layer; and
    a layer of aluminum disposed atop said chrome layer.

6. In an integrated circuit structure having ohmic and high-barrier-height Schottky barrier diode contacts which include metal silicide layers overlying N+ type silicon regions and first N- type silicon regions, respectively, and having low-barrier-height Schottky barrier diode contacts overlying second N- type silicon regions,
    the improvement wherein each of said contacts further comprise:
    a tantalum layer disposed atop each of said metal silicide layers and said second N- type silicon regions;
    a chrome containing chromium oxide layer disposed atop each of said tantalum layers; and
    an aluminum layer disposed atop each of said chrome layers.

* * * * *